(12) United States Patent
Koyata et al.

(10) Patent No.: US 7,645,702 B2
(45) Date of Patent: Jan. 12, 2010

(54) MANUFACTURING METHOD OF SILICON WAFER

(75) Inventors: Sakae Koyata, Tokyo (JP); Kazushige Takaishi, Tokyo (JP)

(73) Assignee: SUMCO Corporation, Tokyo (JP)

( * ) Notice: Subject to any disclaimer, the term of this patent is extended or adjusted under 35 U.S.C. 154(b) by 254 days.

(21) Appl. No.: 10/562,236

(22) PCT Filed: Oct. 28, 2004

(86) PCT No.: PCT/JP2004/016001

§ 371 (c)(1),
(2), (4) Date: Feb. 7, 2007

(87) PCT Pub. No.: WO2005/055301

PCT Pub. Date: Jun. 16, 2005

(65) Prior Publication Data

US 2007/0119817 A1    May 31, 2007

(30) Foreign Application Priority Data

Dec. 1, 2003    (JP)    ............................. 2003-401657

(51) Int. Cl.
*H01L 21/302* (2006.01)
(52) U.S. Cl. .................... 438/692; 438/745; 216/89
(58) Field of Classification Search .............. 438/691, 438/692, 693, 745; 216/89
See application file for complete search history.

(56) References Cited

U.S. PATENT DOCUMENTS

| | | | |
|---|---|---|---|
| 5,866,226 A * | 2/1999 | Masumura et al. ......... | 428/64.1 |
| 5,963,821 A | 10/1999 | Kai et al. | |
| 6,043,156 A * | 3/2000 | Kai et al. .................... | 438/692 |
| 6,099,748 A * | 8/2000 | Netsu et al. ................... | 216/99 |
| 6,227,944 B1 * | 5/2001 | Xin et al. ...................... | 451/41 |
| 2002/0081417 A1 * | 6/2002 | Ushiki et al. ................ | 428/141 |

(Continued)

FOREIGN PATENT DOCUMENTS

EP    1 313 135    5/2003

(Continued)

OTHER PUBLICATIONS

English language Abstract of JP 2003-203890.

(Continued)

*Primary Examiner*—Kin-Chan Chen
(74) *Attorney, Agent, or Firm*—Greenblum & Bernstein, P.L.C.

(57) ABSTRACT

The manufacturing method of the present invention provides a silicon wafer, both sides of the wafer having a highly accurate flatness and small surface roughness, which is a single surface mirror-polished wafer with the front and rear surfaces of the wafer identifiable by visual observation, and excellent in flatness when held by a stepper chuck and the like. The manufacturing method of the present invention includes an etching process, a lapping process, and a double surface polishing process to simultaneously polish the front and rear surfaces of a wafer after the etching process. The polishing removal depth (A) of the wafer front surface is 5 to 10 μm in the double surface simultaneous polishing process, and the polishing removal depth (B) in the rear surface is 2 to 6 μm, and a difference between the polishing removal depth A and the polishing removal depth B is 3 to 4 μm.

3 Claims, 8 Drawing Sheets

U.S. PATENT DOCUMENTS

| | | | |
|---|---|---|---|
| 2003/0171075 A1* | 9/2003 | Nihonmatsu et al. | 451/41 |
| 2004/0072437 A1* | 4/2004 | Iizuka et al. | 438/693 |
| 2005/0112893 A1 | 5/2005 | Koyata et al. | |
| 2005/0142882 A1* | 6/2005 | Kida et al. | 438/692 |

FOREIGN PATENT DOCUMENTS

| | | |
|---|---|---|
| JP | 60-197367 | 10/1985 |
| JP | 05-226203 | 9/1993 |
| JP | 07-045564 | 2/1995 |
| JP | 11-171693 | 6/1999 |
| JP | 11-233485 | 8/1999 |
| JP | 2001-223187 | 8/2001 |
| JP | 2002-025950 | 1/2002 |
| JP | 05-226203 | 4/2003 |
| JP | 2003-100701 | 4/2003 |
| JP | 2003-203890 | 7/2003 |
| JP | 2003-282491 | 10/2003 |

OTHER PUBLICATIONS

English language Abstract of JP 2003-100701.
English language Abstract of JP 11-171693, (Jun. 27, 1996).
English language Abstract of JP 2002-025950.
English language Abstract of JP 05-226203.

* cited by examiner

MANUFACTURING METHOD OF SILICON WAFER

CROSS-REFERENCE TO RELATED APPLICATIONS

This application claims priority of International Application No. PCT/JP2004/016001, filed Oct. 28, 2004 and Japanese Application No. 2003-401657, filed Dec. 01, 2003, the complete disclosures of which are hereby incorporated by reference.

TECHNICAL FIELD

The present invention relates to a manufacturing method of silicon wafer, in which both surfaces of the wafer have a highly accurate flatness and small surface roughness, and moreover, which is a single surface mirror-polished wafer where the front and rear surfaces of the wafer are identifiable by visual observation, and excellent in flatness when held by a stepper chuck and the like.

BACKGROUND ART

In general, the manufacturing process of a semiconductor wafer is constituted by process flow in which a wafer obtained by slicing out from a pulled out silicon single crystal ingot is chamfered, mechanically polished (lapped), etched, mirror-polished (polished), and cleaned so as to be produced as a wafer having a highly accurate flatness.

The silicon wafer gone through machining process such as block cutting off, outer diameter grinding, slicing, lapping and the like has damaged layers, that is, degraded superficial layers in the surface. The degraded superficial layers induce a crystal defect such as a slip dislocation and the like in a device manufacturing process, and reduce mechanical strength of the wafer, and exert adverse effect on electrical characteristics, and therefore, must be completely removed.

To remove these degraded superficial layers, an etching processing is performed. The etching processing includes an acid etching using an acid etching solution, and an alkali etching using an alkali etching solution.

However, when the acid etching is performed, the flatness obtained by lapping is harmed, and a warp in mm order and unevenness called as peel are generated in the etching surface. Further, there has been a problem in that when the alkali etching is performed, a pit (hereinafter referred to as a facet) having a local depth of several μm and a size of approx several tens of μm is generated.

Figure 7:
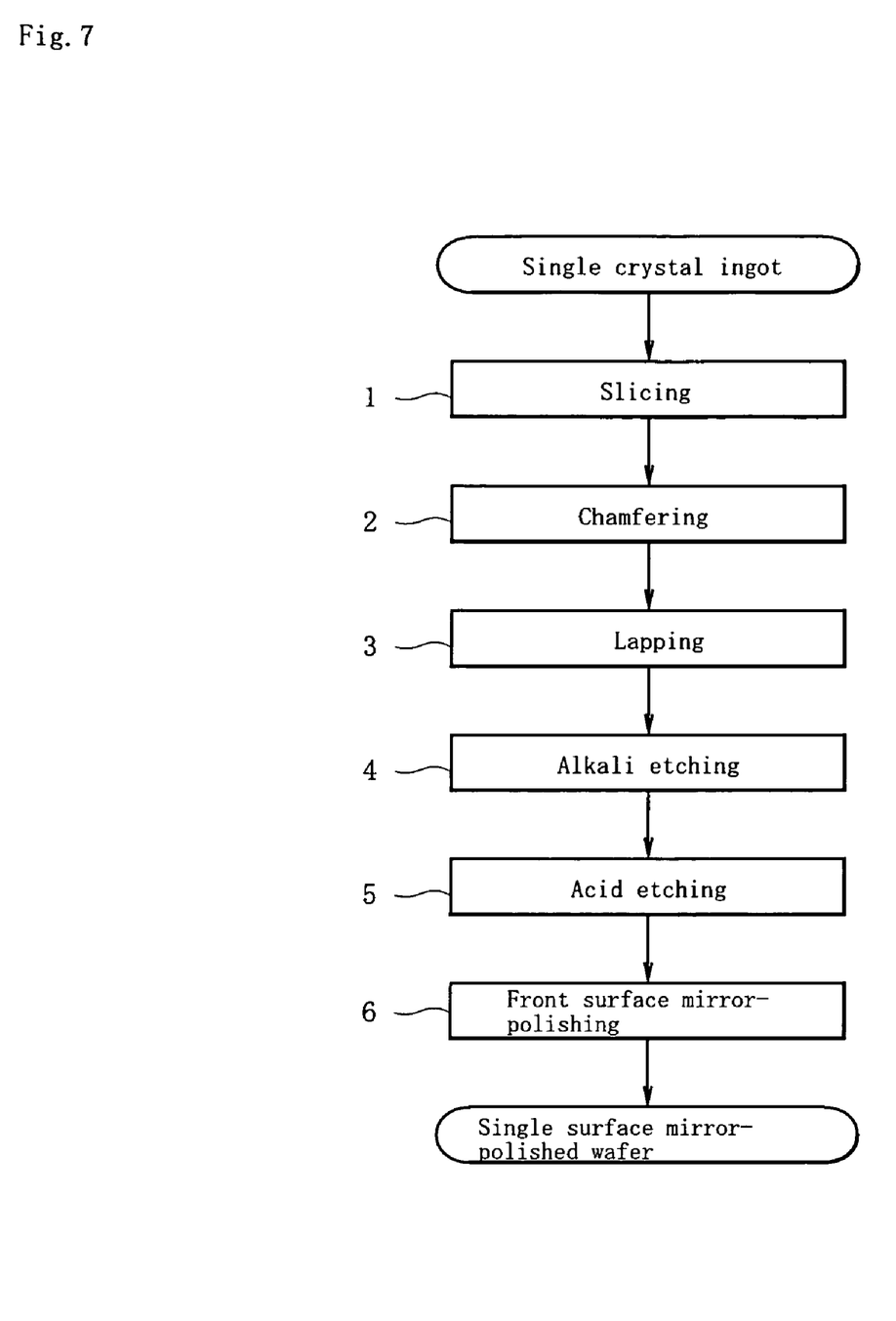
FIG. 7 is a process drawing showing the manufacturing method of the conventional silicon wafer.

As the method of solving the above described problem, as shown in FIG. 7, in the processing method of the semiconductor wafer comprising a process of at least chamfering 2, lapping 3, etching 4 and 5, mirror-polishing 6, and cleaning the semiconductor wafer obtained by slicing 1 the single silicon crystal ingot, there is proposed a processing method of the wafer and the wafer processed by this method in which the etching process is performed by the alkali etching 4, and after that, by the acid etching 5, and at this time, an etching removal depth of the alkali etching is made larger than the etching removal depth of the acid etching 5 (for example, see Patent Document 1).

By the method shown in the Patent Document 1, the flatness after the lapping can be maintained, and the warp of the wafer surface after the etching can be reduced, and generation of the locally deep pit and deterioration of the surface roughness can be controlled. At the same time, it is possible to prepare a chemical etching wafer having an etching surface hard to develop contamination such as particles, stain, and the like. Such a wafer can reduce a removal depth in mirror-polishing, and improve the flatness.

Patent Document 1: Japanese Unexamined Patent Application Publication No. 11-233485

DISCLOSURE OF THE INVENTION

Problems to be Solved by the Invention

However, in the wafer (hereinafter referred to as PW: Polished Wafer) in which the front surface of the wafer is subjected to the mirror-polishing 6 as shown in the Patent Document 1, there has been a problem that it is not possible to obtain a wafer having a good flatness as desired by a device maker and being small in the rear surface roughness of the PW.

On the other hand, accompanied with high integration of the device, when the device is prepared by a lithography process, the device maker feels the necessity increased for considering wafer flatness (hereinafter referred to as flatness at chucking time) in a state in which the wafer is held within a stepper (exposing apparatus). Within the stepper, to hold the wafer, the wafer is kept absorbed by the stepper chuck, and therefore, the wafer absorbing position, the holding structure, the shape, and the like of this stepper chuck affect the flatness at the chucking time. Further, in the wafer, the wafer outer peripheral shape and the rear surface roughness of the wafer before mirror-polishing affect flatness at the chucking time.

Figure 8:
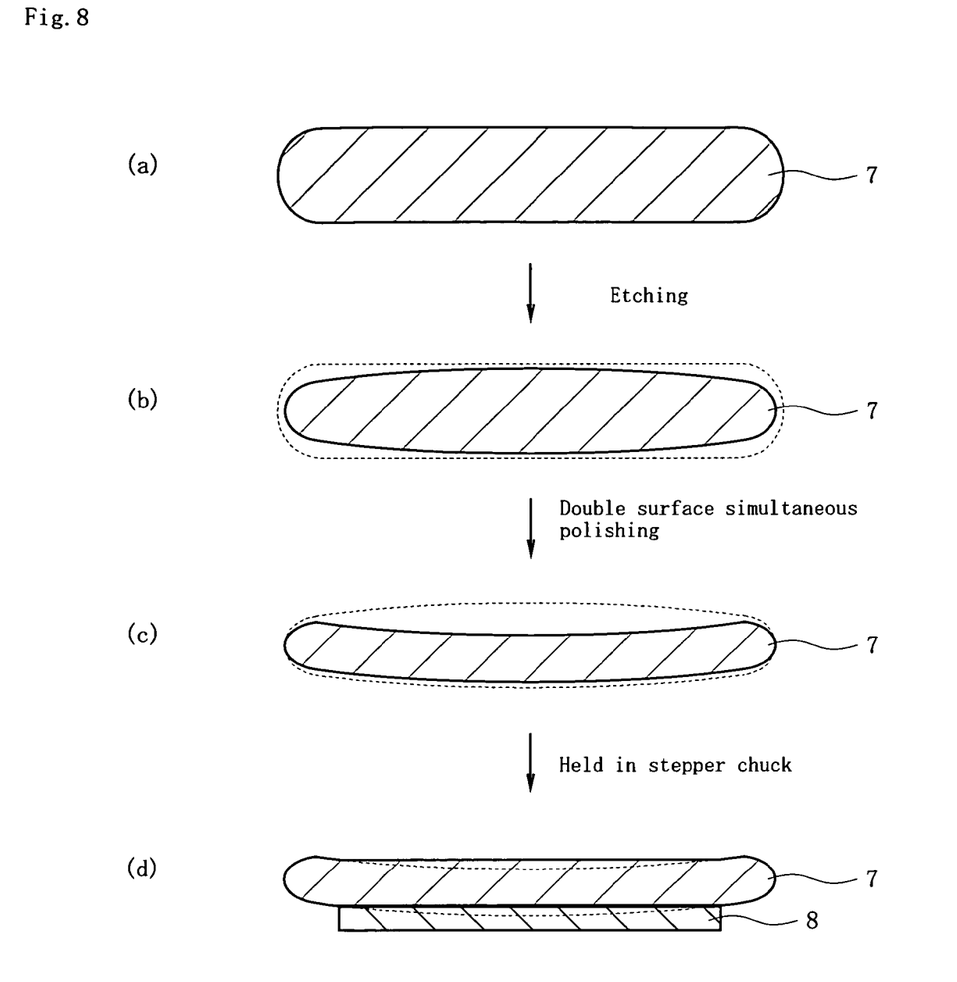
FIG. 8 is a wafer sectional view when the wafer having become thin in thickness of the edge portion comparing to the center portion by etching is held by the stepper chuck.

For example, as shown in FIGS. 8(a) and 8(b), when degraded superficial layers are removed from a wafer 7 having these degraded superficial layers by the etching process, in case the thickness of the edge portion becomes thin comparing to the wafer center portion, in the subsequent double surface simultaneous polishing process, as shown in FIG. 8(c), the shape of the wafer front surface is polished so as to follow the shape of the wafer rear surface by processing pressure of an upper lapping plate of the double surface polisher, and therefore, the wafer after the double surface polishing looks like being formed with a warp. As shown in FIG. 8(d), when this wafer 7 is held by a stepper chuck 8, in the vicinity of the edge, the flatness cannot be maintained, and comparing to the wafer center portion, the wafer is put into a warped state. In this manner, when the flatness is different in the wafer center portion and the edge portion, the edge portion and its vicinity cannot be utilized as a device preparing area, and therefore, there has been a trouble of the yield ratio becoming degraded.

Figure 9:
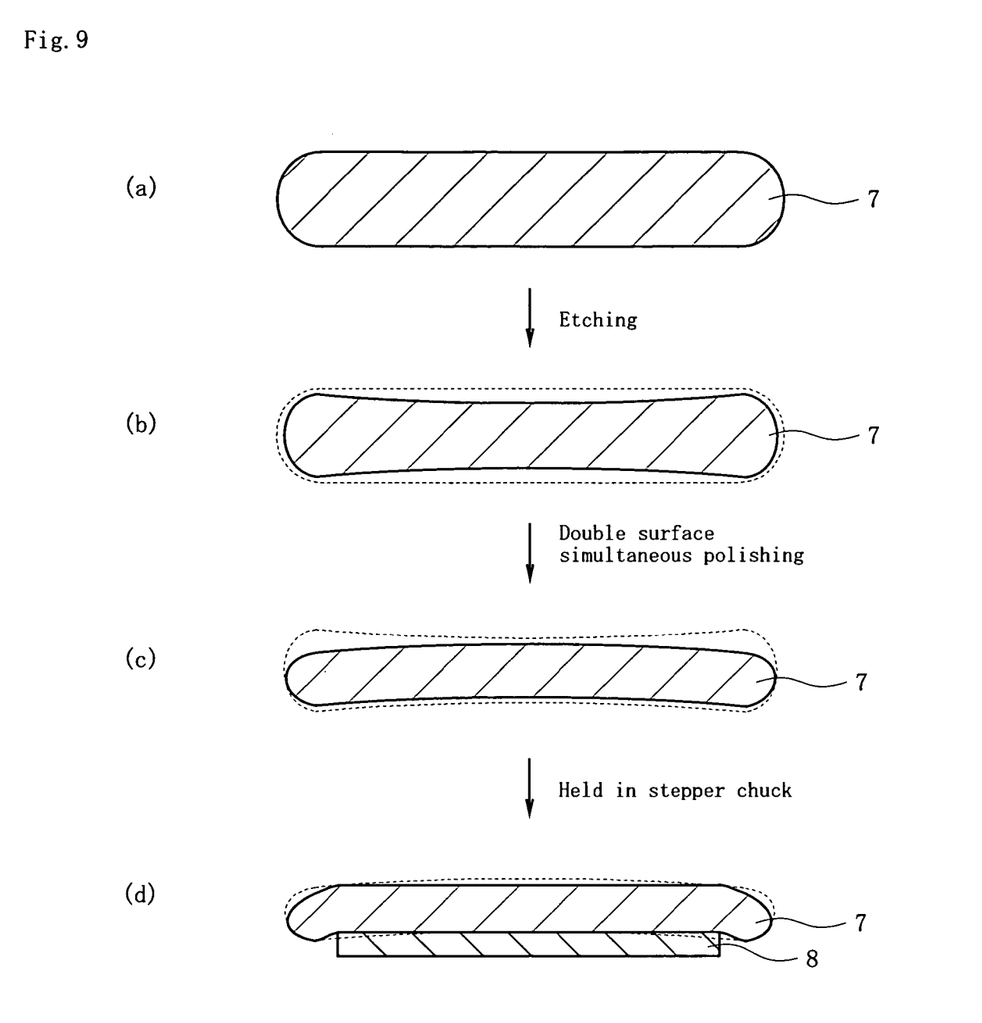
FIG. 9 is a wafer sectional view when the wafer having become thick in thickness of the edge portion comparing to the center portion by etching is held by the stepper chuck.

Further, as shown in FIGS. 9(a) and 9(b), when degraded superficial layers are removed from a wafer 7 having these degraded superficial layers by the etching process, in case the thickness of the edge portion becomes thick comparing to the wafer center portion, in the subsequent double surface simultaneous polishing process, as shown in FIG. 9(c), the shape of the wafer front surface is polished so as to follow the shape of the wafer rear surface by processing pressure of an upper lapping plate of the double surface polisher, and therefore, the wafer after the double surface polishing looks like being formed with a warp. As shown in FIG. 9(d), when this wafer 7 is held by a stepper chuck 8, in the vicinity of the edge portion, the flatness cannot be maintained, and the flatness becomes different at the wafer center portion and the edge portion, and thus there has been a trouble of being not able to use the edge portion and its vicinity as a device preparing region.

An object of the present invention is to provide a manufacturing method of the silicon wafer, in which both surfaces of the wafer have a highly accurate flatness and small surface roughness, and moreover, the front and rear surfaces of the wafer are identifiable by visual observation, and excellent in flatness in a state in which it is held by a stepper chuck and the like.

Means for Solving the Problems

Figure 1:
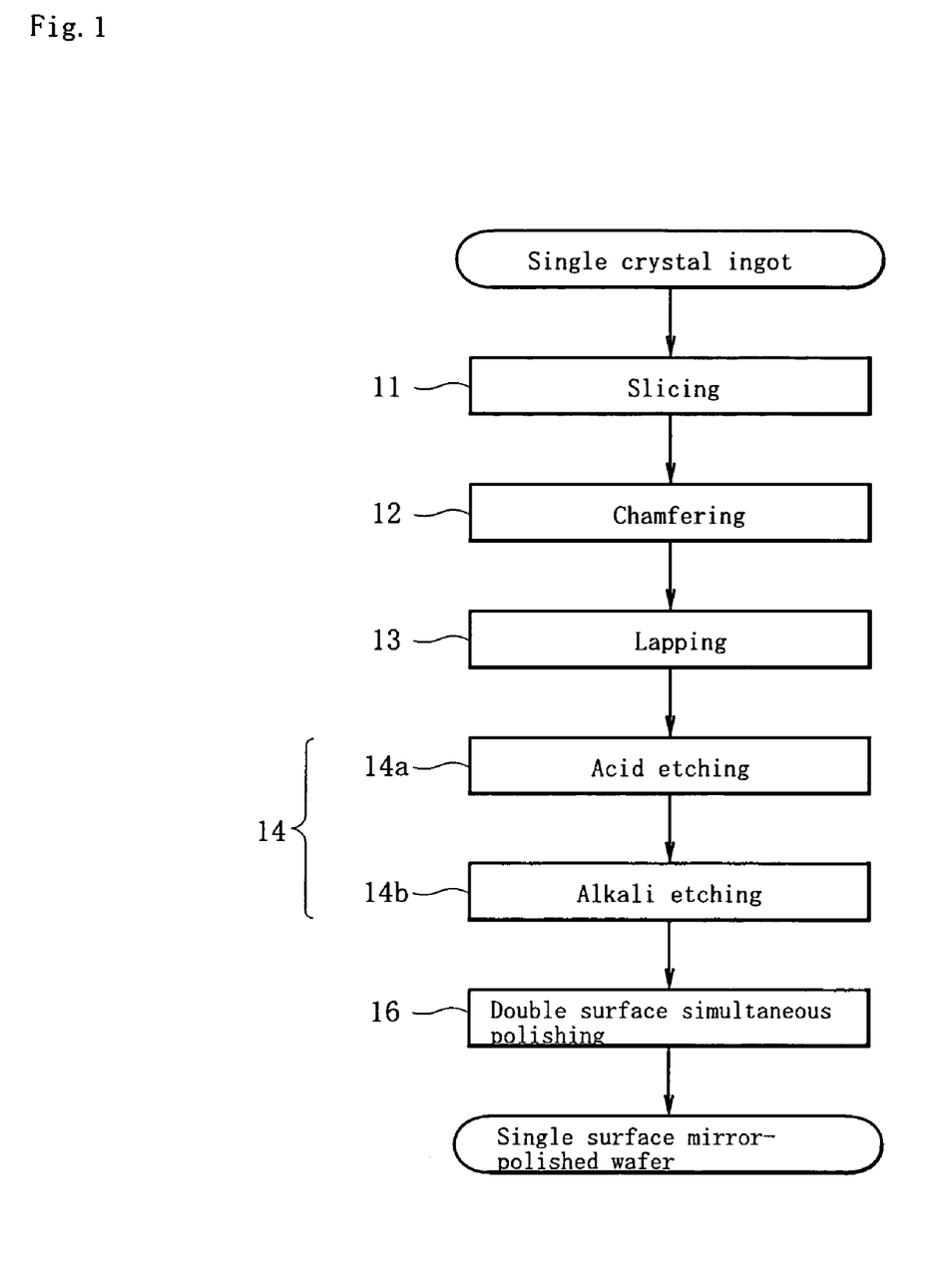
FIG. 1 is a process drawing showing the manufacturing method of a silicon wafer of the present invention.

A first aspect of the invention according to claim 1, as shown in FIG. 1, is the improvement of the manufacturing method of the silicon wafer including an etching process 14 in which the acid etching solution and the alkali etching solution are stored respectively in plural etching tanks, and the silicon wafer gone through the lapping process and having degraded superficial layers is immersed into the acid etching solution and the alkali etching solution in order so as to remove the degraded superficial layers, and a double surface simultaneous polishing process 16 to simultaneously polish the front and rear surfaces of the wafer after the etching process.

The characteristic of this constitution lies in the fact that sodium hydroxide of 40 to 60 percent by weight is used in the alkali etching solution of the etching process 14, and the polishing removal depth A in the wafer front surface is made 5 to 10 μm in the double surface simultaneous polishing process 16, and the polishing removal depth B in the wafer rear surface is made 2 to 6 μm, and the difference (A−B) between the polishing removal depth A and the polishing removal depth B is made 3 to 4 μm.

According to the manufacturing method according to claim 1, by the etching process 14 using the sodium hydroxide solution, the control of roughness and texture size of the material before polishing, and the control of an outer peripheral shape can be performed, and through the prescription of each removal depth in the front and rear surfaces by the double surface simultaneous polishing process 16, the both surfaces of the wafer can be led to a highly accurate flatness, and moreover, the rear surface roughness can be reduced. Further, a single surface mirror-polished wafer identifiable by visually observing the front and rear surfaces of the wafer can be obtained. Further, the wafer excellent in wafer flatness in a state held in the stepper chuck and the like can be obtained.

A second aspect of the invention according to claim 2 is the first aspect of the invention according to claim 1, and is the manufacturing method in which the etching process 14 is performed by the alkali etching after the acid etching.

According to the manufacturing method according to claim 2, the surface of the wafer subjected to the etching in this order has few facet having a large size, and the generation of a deep pit can be also controlled.

A third aspect of the invention according to claim 3 is the first or second aspect of the invention according to claim 1 or claim 2, and is the manufacturing method in which the number of acid etching tanks is made 1 to 3, and the number of alkali etching tanks is made 1 to 3.

A fourth aspect of the invention according to claim 4 is any one aspect of the invention according to claims 1 to 3, and is the manufacturing method in which the acid etching solution contains each of hydrofluoric acid, nitric acid, acetic acid, and water.

The manufacturing method according to claim 4 is a manufacturing method in which, by using the acid etching solution, the flatness after the lapping can be maintained, and at the same time, the surface roughness can be reduced.

A fifth aspect of the invention according to claim 5 is the fourth aspect of the invention according to claim 4 in which, when the resistance value of the silicon wafer is below 1Ω·cm, the mixing ratio of hydrofluoric acid, nitric acid, acetic acid, and water is hydrofluoric acid: nitric acid: acetic acid: water=1:1 to 5:3 to 8:3 to 7 by weight ratio.

A sixth aspect of the invention according to claim 6 is the fourth aspect of the invention according to claim 4 in which, when the resistance value of the silicon wafer is equal to or more than 1Ω·cm, the mixing ratio of hydrofluoric acid, nitric acid, acetic acid, and water is hydrofluoric acid: nitric acid: acetic acid: water=1:5 to 9:1 to 6:1 to 5 by weight ratio.

EFFECTS OF THE INVENTION

As described above, the manufacturing method of the silicon ware of the present invention is the improvement of the manufacturing method of the silicon wafer including an etching process in which the acid etching solution and the alkali etching solution are stored respectively in plural etching tanks, and the silicon wafer gone through the lapping process and having degraded superficial layers is immersed into the acid etching solution and the alkali etching solution in order so as to remove the degraded superficial layers, and a double surface simultaneous polishing process to simultaneously polish the front and rear surfaces of the wafer after the etching process, and is characterized in that sodium hydroxide of 40 to 60 percent by weight is used in the alkali etching solution of the etching process 14, and the polishing removal depth A in the wafer front surface is made 5 to 10 μm in the double surface simultaneous polishing process 16, and the polishing removal depth B in the rear surface is made 2 to 6 μm, and the difference (A−B) between the polishing removal depth A and the polishing removal depth B is made 3 to 4 μm.

By using the sodium hydroxide solution in the alkali etching solution, the control of roughness and texture size of the material before polishing and the control of an outer peripheral shape can be performed, and through the prescription of the removal depths in the front and rear surfaces by the double surface simultaneous polishing process, the both surfaces of the wafer can be led to a highly accurate flatness, and moreover, the rear surface roughness can be reduced. Further, the single surface mirror-polished wafer identifiable by visually observing the front and rear surfaces of the wafer can be obtained. Further, the wafer excellent in wafer flatness in a state held in the stepper chuck and the like can be obtained.

Best Mode Of Carrying Out The Invention

Next, the best mode of carrying out the invention will be described based on the drawings.

First, a grown silicon single crystal ingot is sliced at the top end and the trailing end so as to become block-shaped, and to make the diameter of the ingot uniform, the outer diameter of the ingot is grinded so as to become a block body. To show a specific crystal orientation, this block body is given an orientation flat or an orientation notch. After this process, as shown in FIG. 1, the block body is sliced with a predetermined angle given to the axial direction of the ingot (process 11). The wafer sliced by the process 11, to protect a crack and a chip on the periphery of the wafer, is subjected to a chamfering process on the periphery of the wafer (process 12). By performing this chamfering process, a crown phenomenon can be controlled, in which an abnormal growth arises in the periphery when, for example, an epitaxial growth develops on the silicon wafer not chamfered and circularly swells. Subsequently, the uneven layer of the wafer surface arisen by the slicing process and the like is mechanically polished (lapped), and the flatness of the wafer surface and the parallelism of the wafer are enhanced (process 13). The wafer treated with the lapping process 13 is cleaned in the cleaning process, and is sent to the next process.

Subsequently, the mechanical degraded superficial layers of the wafer introduced by the chamfering process 12 and the lapping process 13 is completely removed by etching (process 14).

In the etching process 14 of the present invention, acid etching solution and alkali etching solution are stored in plural etching tanks, respectively, and the silicon wafer is immersed into the acid etching solution and the alkali etching solution in order. In the present invention, the etching process 14 is performed by the alkali etching 14b after the acid etching 14a. The surface of the wafer etched respectively in this order has few facet having a large size, and moreover, the generation of a deep pit can be also controlled.

The acid etching solution used for the acid etching 14a contains hydrofluoric acid, nitric acid, acetic acid, and water, respectively. By using such an acid etching solution, the flatness after lapping can be maintained, and at the same time, surface roughness can be reduced. When the wafer is a low resistance product in which the resistance value of the silicon wafer is below 1Ω·cm, the mixing ratio of hydrofluoric acid, nitric acid, acetic acid, and water is prepared to become hydrofluoric acid: nitric acid: acetic acid: water=1:1 to 5:3 to 8:3 to 7 by weight ratio. Further, when the wafer is an ordinary resistance product in which the resistance value of the silicon wafer is above 1Ω·cm, the mixing ratio of hydrofluoric acid, nitric acid, acetic acid, and water is prepared to become hydrofluoric acid: nitric acid: acetic acid: water=1:5 to 9:1 to 6:1 to 5 by weight ratio. The reason why the acid etching solution is prescribed to be the above described mixing ratio is because an etching speed changes depending on the resistance value of the wafer. The lower the resistance value of the wafer is, faster the etching speed by the acid etching solution tends to become. To be specific, in case a low resistance wafer below 1Ω·cm in value of resistance is treated with the acid etching, when the acid etching solution is allowed to have the same degree of the mixing ratio as the acid etching solution used for the ordinary resistive product, there arises a trouble in that the wafer outer periphery after the etching sags down, thereby reducing the flatness. Hence, for the low resistance wafer below 1Ω·cm in resistance value, the ratio of nitric acid is lowered comparing to the mixing ratio of the acid etching solution corresponding to the ordinary resistance wafer equal to or more than 1Ω·cm in resistance value, and at the same time, the ratio of acetic acid and water is increased so as to control the etching speed by the acid etching solution to a suitable speed. A preferable mixing ratio of the acid etching solution when the resistance value of the wafer is below 0.01Ω·cm is hydrofluoric acid: nitric acid: acetic acid: water=1:1 to 3:5 to 7:4 to 6 by weight ratio. Further, a preferable mixing ratio of the acid etching solution when the resistance value of the wafer is equal to and more than 0.01Ω·cm is hydrofluoric acid: nitric acid: acetic acid: water=1:6 to 8:4 to 6:2 to 4 by weight ratio. The alkali etching solution used for the alkali etching 14b is sodium hydroxide aqueous solution of 40 to 60 percent by weight. By using this alkali etching solution, the control of roughness and texture size of the material before polishing and the control of an outer periphery shape can be performed. The density of sodium hydroxide aqueous solution is preferably 50 to 55 percent by weight, and more preferably 51 percent by weight.

In this etching process 14, it is preferable that the number of acid etching tanks is made 1 to 3, and the number of alkali etching tanks is made 1 to 3. A total removal depth of the acid etching 14a in the etching process 14 is made 5 to 10 μm in the sum of the front and rear surfaces of the silicon wafer, and a total removal depth of the alkali etching 14b is made 10 to 15 μm in the sum of the front and rear surfaces of the silicon wafer. A total removal depth in the acid etching 14a is preferably 5 to 7 μm, and a total removal depth in the alkali etching 14b is preferably 13 to 15 μm, respectively. When the total removal depth in the acid etching 14a is below 5 μm, the depth of the pit formed in the alkali etching 14b to follow after does not become shallow, and therefore, the grinding removal depth ends up becoming large, thereby causing a trouble of deteriorating the flatness, and when the depth exceeds 10 μm, a swell (nanotopography) develops, thereby causing a trouble at the device preparing time. When the total removal depth in the alkali etching 14b is below 13 μm, the removal depth of the acid etching 14a becomes large, thereby causing a problem of swell, and when the removal depth exceeds 15 μm, there develops a trouble in that the depth of the pit becomes deeper.

Figure 3:
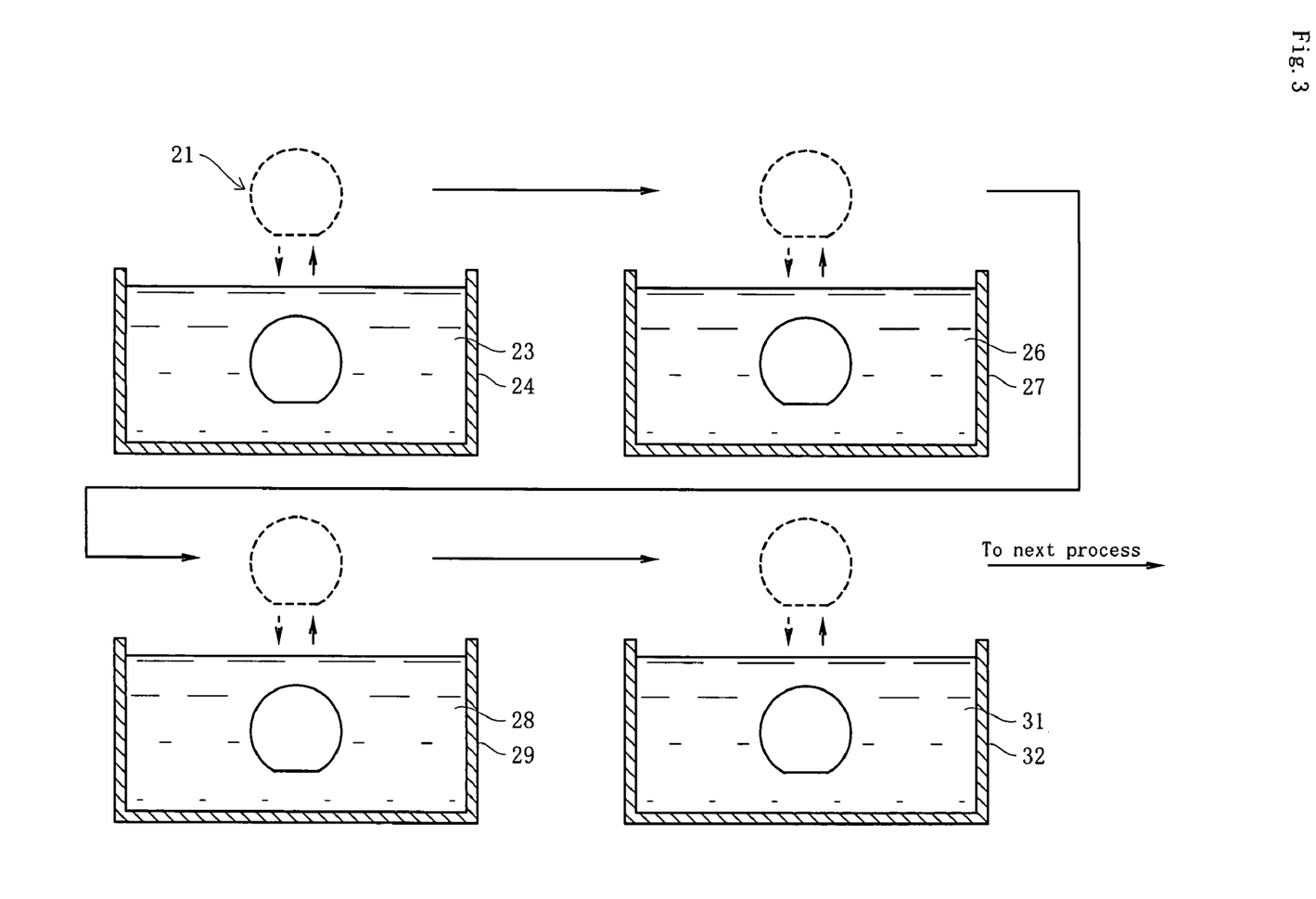
FIG. 3 is a view showing a specific example of the etching process of the present invention.

Further, there is a need to perform a rinse process between each etching process. For example, between the acid etching process 14a and the alkali etching process 14b, there is provided a cleaning process to perform a pure water rinse. By inserting the rinse cleaning process in between, acid and alkali adhered to the wafer are cleaned away, and therefore, in the process to continue subsequently, the carrying over of the detergent from the etching tank of the preceding process can be prevented, and fluctuation of the composition of the detergent can be controlled to the minimum. To be specific, as shown in FIG. 3, first, after the wafer 21 is immersed into the etching tank 24 stored with the acid etching solution 23 for a fixed period of time, the wafer 21 is pulled out from the etching tank 24, and then, the wafer 21 is immersed into a water tank 27 stored with a pure water 26 so as to be cleaned off the acid adhered with the wafer. Next, after the wafer 21 is immersed into the etching tank 29 stored with the alkali etching solution 28 for a fixed period of time, the wafer 21 is pulled out from the etching tank 29, and subsequently, the wafer 21 is immersed into a water tank 32 stored with a pure water 31, thereby cleaning off acid adhered with the wafer.

Figure 2:
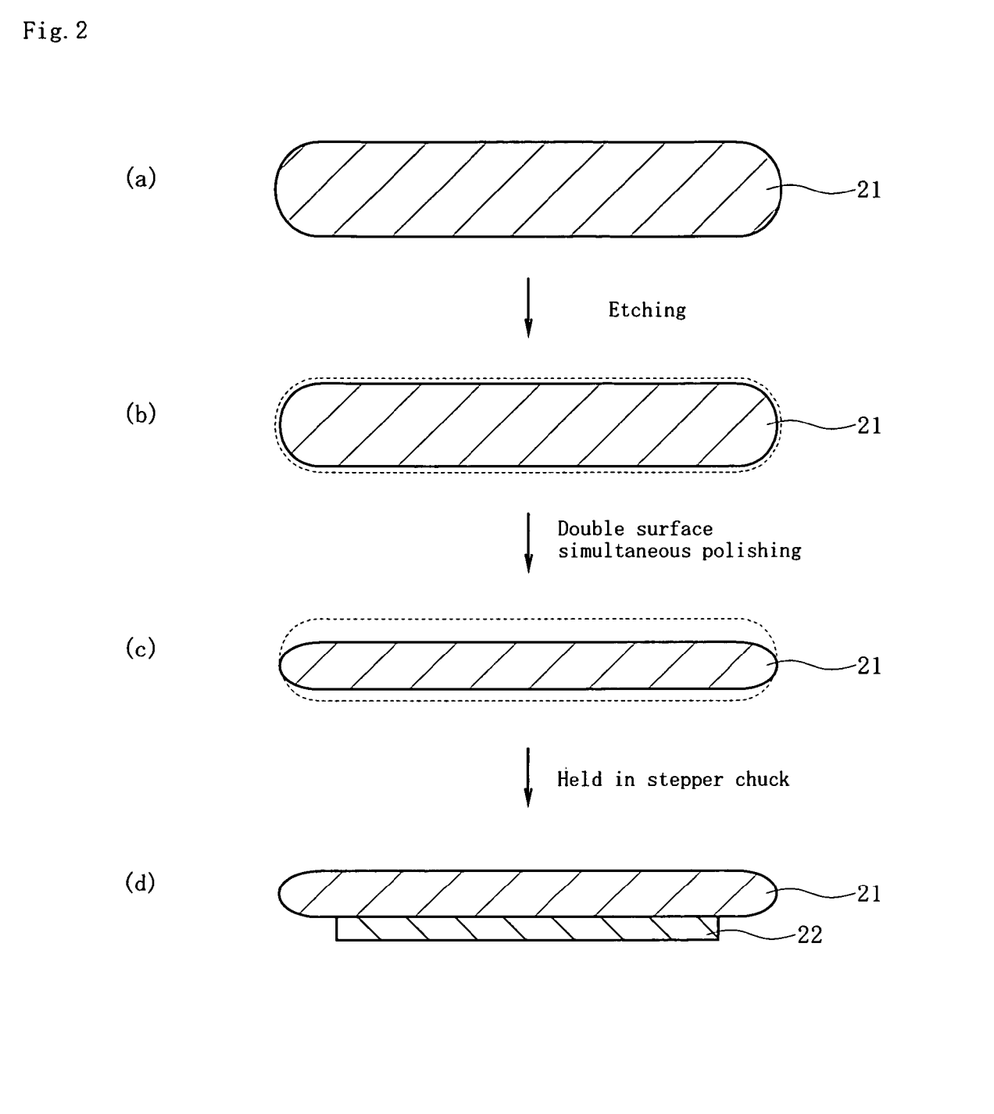
FIG. 2 is a wafer sectional view when the wafer gone through the manufacturing method of the silicon wafer of the present invention is held by a stepper chuck.

The wafer having completed such etching process 14 is cleansed off the detergent adhered to the surface in the cleaning process, and is sent to the next process. As shown in FIGS. 2(*a*) and 2(*b*), by treating the wafer 21 having the work damage layer with the etching process 14 of the present invention, the control of roughness and texture size of the material before polishing and the control of an outer periphery shape can be performed. By controlling the shape of the outer peripheral portion of the wafer, the wafer flatness in a state chucked to the stepper in the wafer outer peripheral portion at a device process of the subsequent process can be controlled.

Next, returning to FIG. 1, a double surface simultaneous polishing is conducted (process 16), in which the front and rear surfaces of the wafer having completed the etching process 14 are simultaneously polished.

Figure 4:
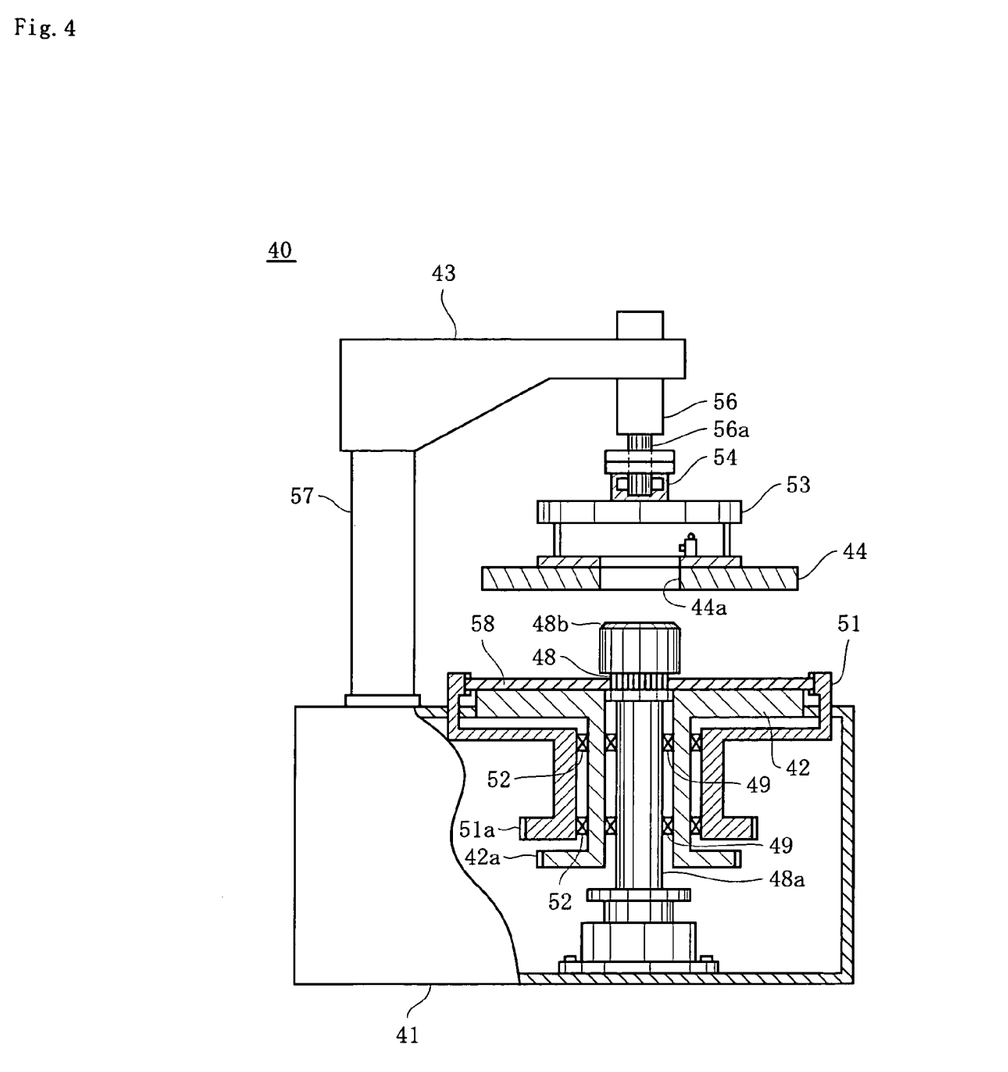
FIG. 4 is a front view showing the structure of a double surface simultaneous polisher.

In FIG. 4 is shown a partially broken view of a common double surface simultaneous polisher 40. The double surface simultaneous polisher 40 has a lower lapping plate 42 disposed on the upper portion within a frame body 41 and an upper lapping plate 44 hung by an arm 43. The lower lapping plate 42 is a disc shaped body to rotate by mounting an unillustrated carrier. By allowing the wafer gone through the double surface simultaneous polishing to be held by the unillustrated carrier, the lower lapping plate 42 is constituted in such a manner as to rotate and subject the rear surface of the wafer to the double surface simultaneous polishing. This lower lapping plate 42 is rotatably mounted outside of a driving shaft 48a having a sun gear 48 on the upper portion through a pair of upper and lower bearings 49. The outside of the lower lapping plate 42 is rotatably mounted with an internal gear 51 through a pair of upper and lower bearings 52.

The lower lapping plate 42 and the internal gear 51 are connected to an unillustrated motor through gears 42a and 51a provided respectively in the lower portions thereof. The upper end of the driving shaft 48a is rotatably provided with a driver 48b to rotationally drive the upper lapping plate 44, and this driver 48a coaxially passes and extends through a hollow interior of the driving shaft 48a, and moreover is connected to the upper end of an inner driving shaft (not shown) rotatably supported. This inner driving shaft and the driving shaft 48a are operationally connected by planetary gear mechanism (not shown) and the like, and the driver 48b, accompanied with the rotation of the driving shaft 48a, is rotated in a direction reverse to the sun gear 48 through the planetary gear mechanism and the like.

The upper lapping plate 44 is a disc shaped body in which a center hole 44a insertable by a driver 48b is formed at its center portion, and rotates while pressing down the wafer held by an unillustrated carrier from the above, thereby lapping the upper surface of the wafer. This upper lapping plate 44 is supported by an upper lapping plate hunger 53. To be specific, the upper surface of the upper lapping plate hunger 53 supporting the upper lapping plate 44 is fixed with a bearing 54, and this bearing 54 is inserted with a rod 56a of a cylinder 56. The cylinder 56 is supported by an arm 43 of a pole 57 erected in the frame body 41. In this manner, the upper lapping plate 44 is rotatably supported by the rod 56a of the cylinder 56 through the upper lapping plate hunger 53 and the bearing 54.

Figure 5:
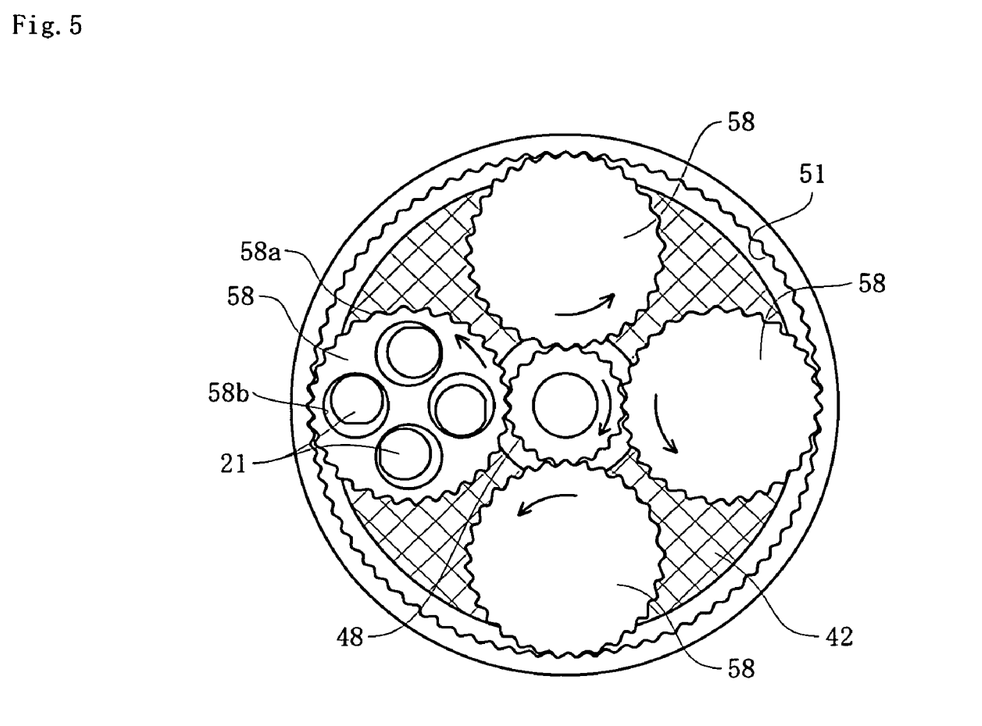
FIG. 5 is a top plan view showing a state in which a carrier providing a wafer in a process hole is disposed on a lower lapping plate.
Figure 6:
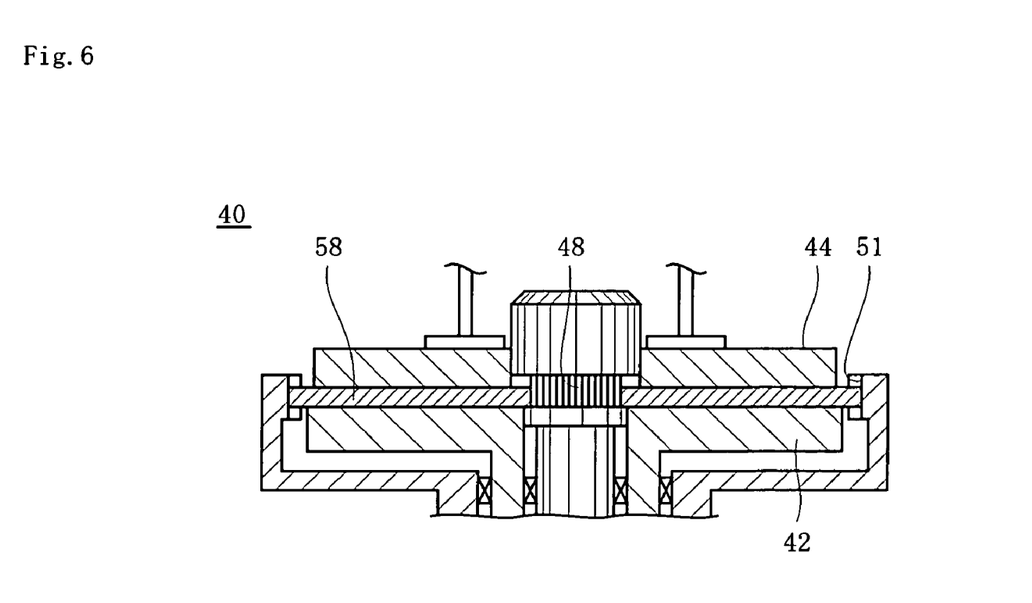
FIG. 6 is a longitudinal sectional view showing a state in which the carrier is nipped between the lower lapping plate and the upper lapping plate.

As shown in FIGS. 5 and 6, the double surface simultaneous polisher 40 is formed with external teeth 58a in the periphery, and a carrier 58 formed with process holes 58b inserted with the wafer in the interior is mounted between the under lapping plate 42 and the upper lapping plate 44, and the external teeth 58a are engaged with the internal gear 51 of the double surface simultaneous polisher 40 and the sun gear 48, respectively, and are nipped between the under lapping plate 42 and the upper lapping plate 44, and are provided so as to move around the sun gear, while rotating on its axis.

The wafer is fitted between the process holes 58b, and in a state in which the wafer 21 is held in the process holes 58b of the carrier 58, the carrier 58 is rotated, and the front and rear surfaces of the wafer 21 nipped by the upper lapping plate 44 and the lower lapping plate 42 are simultaneously polished. The polishing is performed and controlled in such a manner that the polishing removal depth A in the front surface of the wafer 21 in the double surface simultaneous polishing process 16 at this time becomes 5 to 10 µm, and the polishing removal depth B in the rear surface becomes 2 to 6 µm, and the difference (A-B) between the polishing removal depth A and the polishing removal depth B becomes 3 to 4 µm. The reason why the polishing removal depth A is prescribed to be 5 to 10 µm is because, if the polishing removal depth A is below 5 µm, the wafer front surface obtained after the manufacturing process does not become a complete mirror surface, and there arises a possibility that pits are left on the wafer front surface, and when the polishing removal depth A exceeds 10 µm, sagging occurs in the outer periphery of the wafer, thereby deteriorating the flatness. The reason why the polishing removal depth B is prescribed to be 2 to 6 µm is because, if the polishing removal depth B is below 2 µm, the reduction of the rear surface roughness becomes hardly adequate, and the wafer flatness on the stepper chuck is deteriorated, that is, the polishing removal depth B having a slight polishing degree below the above described numerical value is not sufficient to reduce the roughness, and when the polishing removal depth B exceeds 6 µm, the wafer rear surface ends up becoming a mirror-surface, and there is no way to distinguish between the front and rear surfaces. Further, if the polishing removal depth B is large, it tends to deteriorate the flatness. A control is preferably made in such a manner that the polishing removal depth A in the front surface of the wafer 21 becomes 7 to 8 µm, the polishing removal depth B in the rear surface becomes 3 to 4 µm, and the difference (A-B) between the polishing removal depth A and the polishing removal depth B becomes 4 µm. By performing such a control, it is possible to prepare a single surface mirror-polished wafer with the front and rear surfaces of the wafer identifiable, and to optimize the rear surface roughness of the wafer.

In order to control the polishing removal depths in the front and rear surfaces within the above described ranges, for example, a flow rate of abrasive supplied to the wafer is made 1 to 20 L/min and preferably 2 L/min, a loading capacity of the upper lapping plate 44 is made 50 to 500 g/cm² and preferably 200 g/cm², and a ratio of the lower lapping plate number of rotations to the upper lapping plate number of rotations is taken as the upper lapping plate: the lower lapping plate=1:20 to 20 and preferably 1:5.

By the process pressure of the upper lapping plate of the double surface polisher, though the shape of the wafer front surface is polished so as to follow the shape of the wafer rear surface, since the control of roughness and texture size of the material before polishing and the control of an outer peripheral shape is performed by the etching process 14 of the present invention, as shown in FIG. 2(c), a warp is not formed in the wafer 21 after the double surface simultaneous polishing process 16. Further, by treating the water 21 gone through the etching with the double surface simultaneous polishing process 16 of the present invention, the wafer rear surface roughness can be reduced, and moreover, the front and rear surfaces of the wafer can be made into a single surface mirror-polished wafer identifiable by visual observation.

As a result, as shown in FIG. 2(d), even if this wafer 21 is held by the stepper chuck 22, the flatness thereof can be maintained at the wafer center portion and the edge portion, and therefore, the edge portion as well as its vicinity can be used as a device preparing region, thereby enhancing a yield ratio.

INDUSTRIAL APPLICABILITY

The manufacturing method of the silicon wafer of the present invention can provide a silicon wafer, in which both surfaces of the wafer have a highly accurate flatness and small surface roughness, and moreover, which is a single surface mirror-polished wafer with the front and rear surfaces of the wafer identifiable by visual observation, and excellent in flatness when held by a stepper chuck and the like.

REFERENCE NUMERALS

14: Etching process
16: Double surface simultaneous polishing process

What is claimed is:

1. A manufacturing method of a silicon wafer, including:

an etching process (14) storing acid etching solution and alkali etching solution in plural etching tanks, respectively, and immersing a silicon wafer gone through a lapping process and having degraded superficial layers in the acid etching solution and the alkali etching solution in order so as to remove the degraded superficial layers;

a double surface polishing process (16) to simultaneously polish the front and rear surfaces of said wafer after said etching process;

wherein the acid etching solution includes hydrofluoric acid, nitric acid, acetic acid, and water, respectively, wherein, when the resistivity of the silicon wafer is below 1 Ω·cm, the mixing ratio of hydrofluoric acid, nitric acid, acetic acid, and water is hydrofluoric acid: nitric acid: and water=1:1 to 5:3 to 8:3 to 7 by percent by weight, wherein, when the resistivity of the silicon wafer is above 1 Ω·cm, the mixing ratio of hydrofluoric acid, nitric acid, acetic acid, and water is hydrofluoric acid: nitric acid: and water=1:5 to 9:1 to 6:1 to 5 by percent by weight, wherein a total removal depth in the acid etching is 5 to 7 μm, wherein sodium hydroxide aqueous solution of 40 to 60 percent by weight is used in the alkali etching solution of said etching process (14), wherein a total removal depth in the alkali etching is 13 to 15 μm, wherein, in said double surface simultaneous polishing process (16), a flow rate of abrasive supplied to the wafer is made 1 to 20 L/min, a loading capacity of an upper lapping plate is made 50 to 500 g/cm2, and a ratio of a lower lapping plate number of rotations to the upper lapping plate number of rotations is taken as the upper lapping plate: the lower lapping plate=1:2 to 20, thereby making a polishing removal depth A in said wafer front surface is 5 to 10 μm , and making a polishing removal depth B in said rear surface is 2 to 6 μm , and making a difference (A−B) between said polishing removal depth A and said polishing removal depth B is 3 to 4 μm.

2. The manufacturing method according to claim 1, wherein the etching process is performed by the alkali etching after the acid etching.

3. The manufacturing method according to claim 1, wherein the number of acid etching tanks is made 1 to 3, and the number of alkali etching tanks is made 1 to 3.

* * * * *